– – –

United States Patent [19]

Pollock et al.

[11] Patent Number: 6,056,601

[45] Date of Patent: May 2, 2000

[54] PROCESSOR CARD CONNECTOR

[75] Inventors: Steven L. Pollock, Hillsboro; Robert Olivier, Forest Grove, both of Oreg.

[73] Assignee: Intel Corporation, Santa Clara, Calif.

[21] Appl. No.: 08/997,688

[22] Filed: Dec. 23, 1997

[51] Int. Cl.[7] ................................................. H01R 23/70
[52] U.S. Cl. ............................... 439/630; 439/74; 439/44
[58] Field of Search .................................... 439/630, 631, 439/632, 629, 638, 639, 640, 644, 55, 59, 64, 67, 74, 75, 76.1, 77, 78, 79, 80, 81, 82, 84, 43, 44, 47, 48, 325–331

[56] References Cited

U.S. PATENT DOCUMENTS

| 5,003,431 | 3/1991 | Imsdahl | 439/64 |
| 5,149,276 | 9/1992 | Dixon | 439/159 |
| 5,268,820 | 12/1993 | Tseng et al. | 439/630 |
| 5,688,140 | 11/1997 | McHugh et al. | 439/342 |
| 5,689,405 | 11/1997 | Bethurum | 439/79 |
| 5,827,075 | 10/1998 | Futatsugi et al. | 439/80 |

*Primary Examiner*—Lincoln Donovan
*Attorney, Agent, or Firm*—Kenyon & Kenyon

[57] ABSTRACT

A connector for mounting a processor card on a motherboard includes a base and an upper support chassis. The base is electrically and structurally coupled to a motherboard and the upper support chassis is mounted on the base. A processor card is received within the upper support chassis for mounting of the card to the motherboard. When the card is received within the upper support chassis, the processor card is positioned substantially parallel to the motherboard.

13 Claims, 3 Drawing Sheets

PROCESSOR CARD CONNECTOR

BACKGROUND OF THE INVENTION

1. Field of the Invention

The present invention relates to a connector for electrically and physically mounting a processor card on a motherboard.

2. Description of the Related Art

Currently, processor cards are mounted perpendicularly and vertically on motherboards in edge connectors. There are drawbacks with this known method of mounting processor cards. When considering the physical configuration of the processor card, vertically mounting the card on the motherboard in a perpendicular orientation to the motherboard results in undesired physical stresses on the card. Processor cards are physically configured as thin, rectangular or square-shaped structures, which results in the card having large surface areas on the top and bottom of the card and small surface areas on each side edge of the card. Currently, as stated above, processor cards are vertically mounted on motherboards, i.e., with a single side edge of the card mounted on the motherboard, which results in the relatively small surface area of the card's side edge having to support the entire weight of the card. Also, not only is the side edge of the card required to support the weight of the card itself, but additionally the small surface area must support the heat sink on the card, if installed, as well. An additional drawback with current mounting methods is that, because there is only a single connection point between the processor card and the motherboard, significant moments are created about this point.

Therefore, because a very small surface area is required to support a relatively heavy weight, and further because the single mounting connection point between the card and the motherboard must be able to withstand the moments applied to this single connection point, a complex and cumbersome system of supports, guides and brackets may be required to adequately support the perpendicularly mounted processor card. In addition, such a support structure may require a large surface area on the motherboard for securing the support structure to the motherboard. This can result in difficulties when designing the motherboard due to the requirement to accommodate the supporting structure on the surface of the motherboard. Additionally, shake and vibration problems may still exist. Again, this can result from the weight and moments that must be carried by the single connection point between the edge of the processor card and the motherboard when vertically mounting the processor card.

An additional problem with the presently utilized system of mounting the processor card is that of heat dissipation. Because the card's largest surface area is vertically mounted, as heat dissipates from the card it does not dissipate directly away from the card but rather, as the heat dissipates upward, the heat will travel across the surface of the vertically mounted card. Thus, for some period of time, the dissipated heat remains in contact with the surface of the card, resulting in reduced heat transfer from the card.

Therefore, it would be desirable to provide a method and apparatus for mounting a processor card on a motherboard that would eliminate the requirement to utilize a complex system of supports and that would allow for more efficient heat transfer from the processor card.

SUMMARY OF THE INVENTION

A method and apparatus is provided to mount a processor card on a motherboard. The processor card is mounted by supporting the processor card in a substantially parallel adjacent relationship to the motherboard.

DETAILED DESCRIPTION

Figure 1:
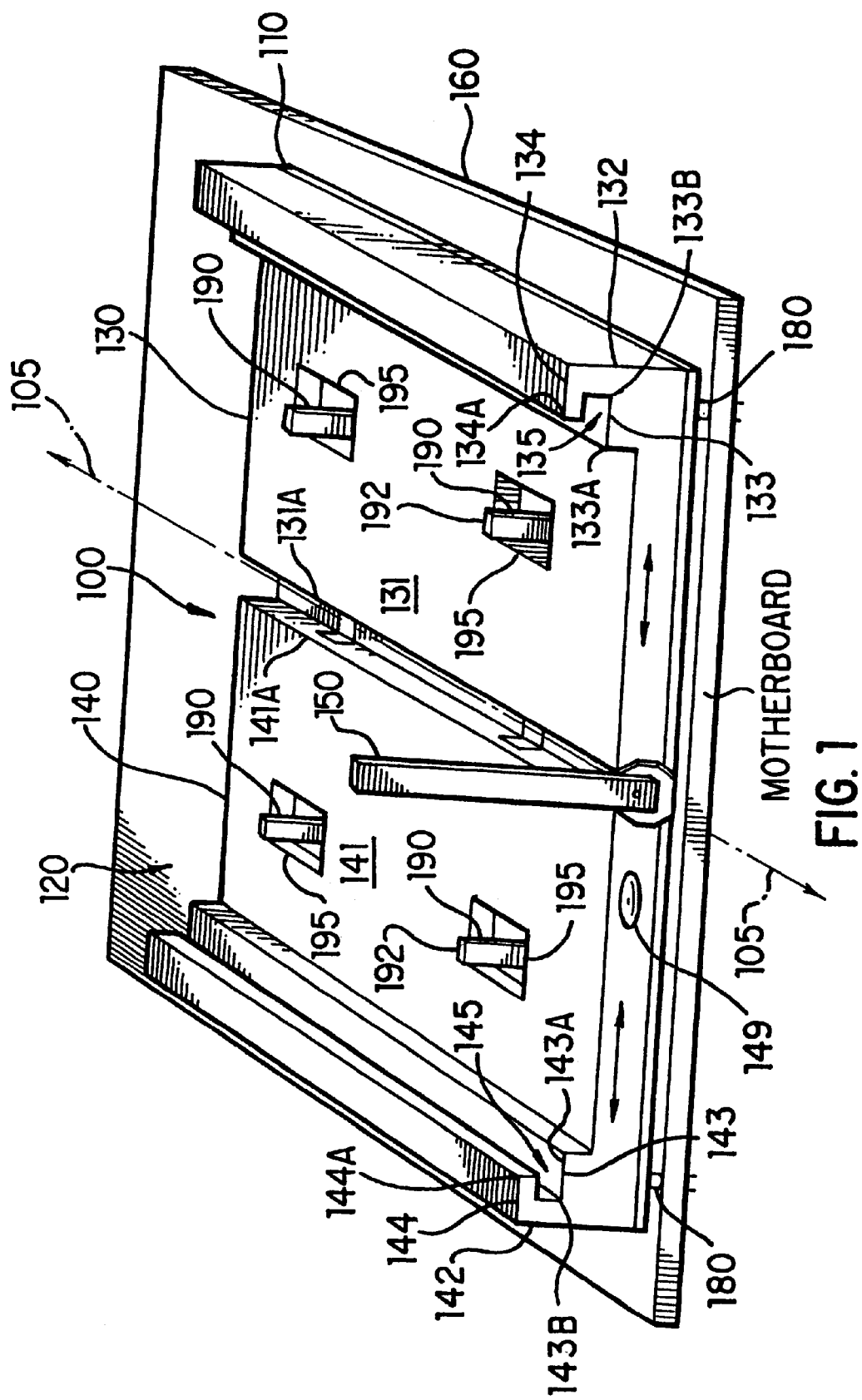
FIG. 1 is a perspective view of one embodiment of the connector of the present invention.
Figure 5:
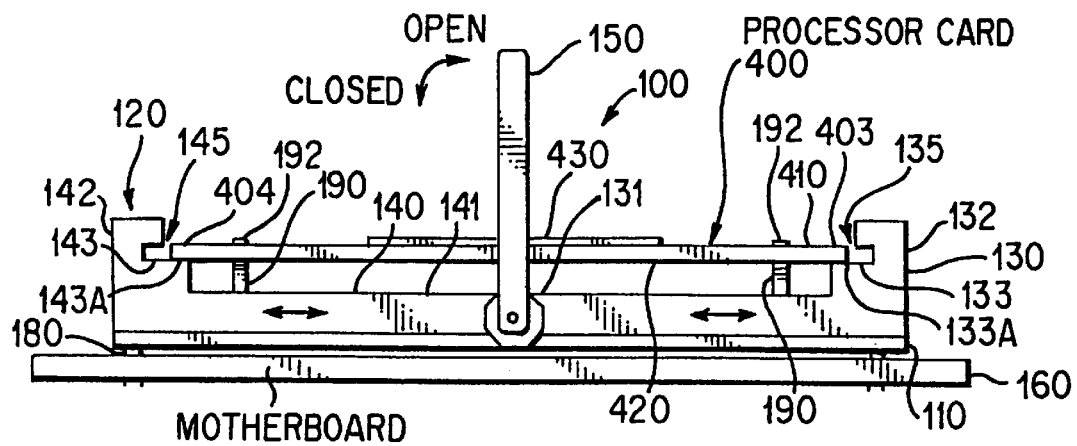
FIG. 5 is a side view of the connector of FIG. 1 with a processor card inserted into the connector and with the handle in the open position.
Figure 6:
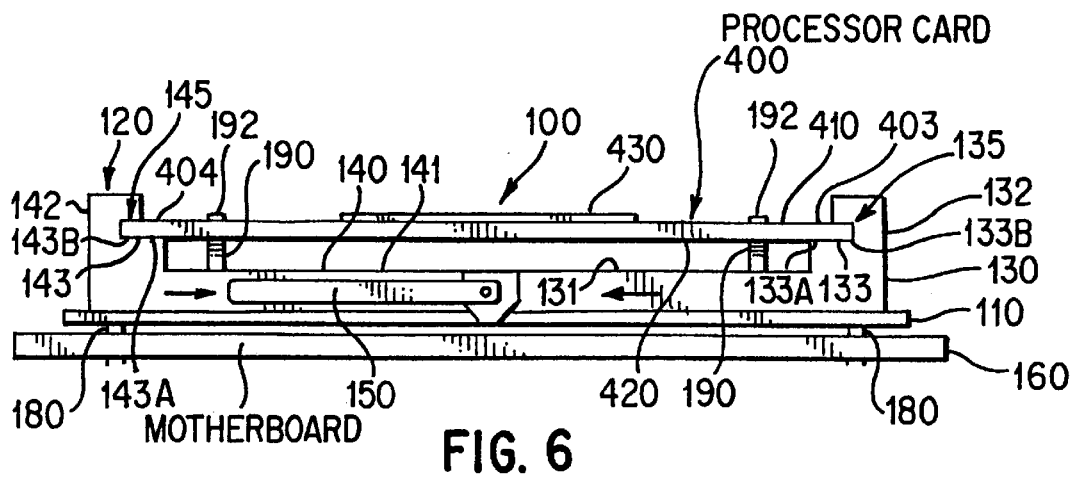
FIG. 6 is a side view of the connector of FIG. 1 with a processor card inserted into the connector and with the handle in the closed position.

FIG. 1 illustrates one embodiment for connector 100 of the present invention. As can be seen, connector 100 includes a base 110, an upper support chassis 120, and a handle 150. A processor card 400, as shown in FIGS. 5 and 6, is received within the upper support chassis 120 of the connector. When the processor card 400 is mounted in the upper support chassis 120, the processor card is positioned in a substantially parallel orientation with respect to the motherboard 160, and in this embodiment in a horizontal orientation as well, as is also shown in FIGS. 5 and 6. In this position, the top 410 of processor card 400, on which is mounted central processor unit (CPU) 430, and bottom 420, i.e., those sides which constitute the largest surface areas of the card, lie substantially parallel to the base 110 of connector 100 and, thus, lie substantially parallel to the motherboard 160 as well.

Figure 2:
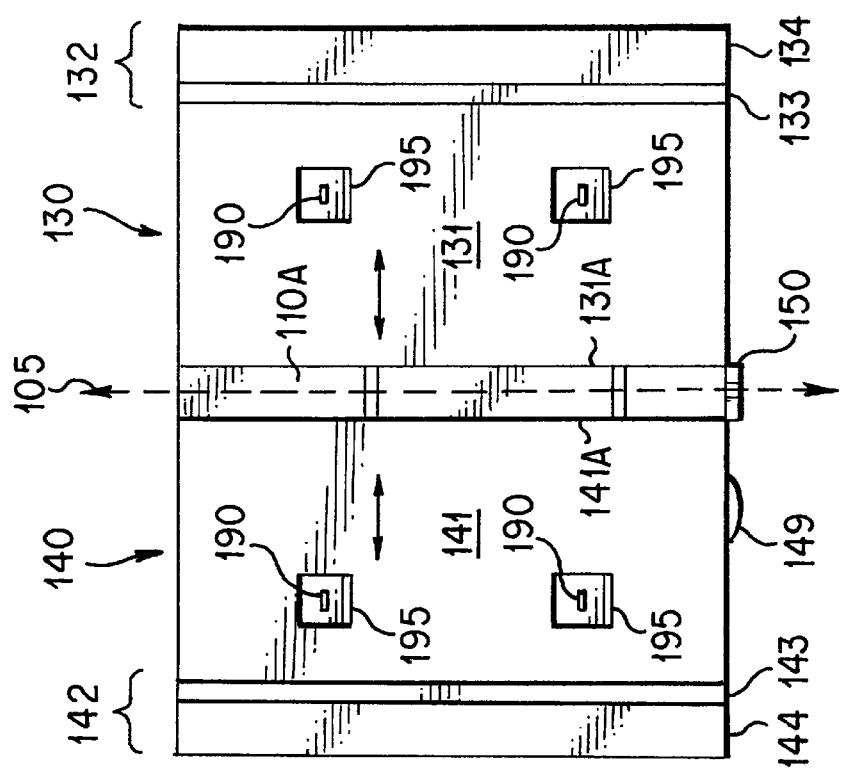
FIG. 2 is a top view of the connector of FIG. 1.

In further describing connector 100, upper support chassis 120 is slidably mounted on base 110. Upper support chassis 120 consists of two support arms 130, 140 which are separate structural components that are slidably mounted to base 110. Support arms 130, 140 slide along base 110 in the directions as indicated in FIGS. 1 and 2. As such, the support arms can diverge from each other and converge towards each other while sliding along base 110.

Support arms 130, 140 are slidably mounted on base 110 by well-known means in the art. As such, any number of structural configurations are possible for slidably mounting the support arms to the base such that movement of the support arms is achievable. For example, a tongue and groove arrangement between the arms and the base can be provided so that the arms can be maintained in contact with the base but yet allow for motion of the arms along the base. The present invention is not limited to any particular embodiment for slidably mounting the upper support chassis 120, and thus support arms 130, 140, to base 110.

Continuing with the description of the structure of upper support chassis 120 and support arms 130, 140, each support arm may be identically formed. As such, as is shown in FIGS. 1 and 2, arms 130, 140 are comprised of sliding structures 131 and 141, respectively, and mounting structures 132, 142, respectively. Sliding structures 131 and 141 are thin planar members that are rectangularly shaped, lie parallel to base 110, i.e., in a horizontal orientation, and are slidably mounted to base 110, as discussed above.

Integrally formed with sliding structures 131, 141 are mounting structures 132, 142, respectively. Mounting structures 132, 142 provide for the physical and electrical mounting of a processor card to the connector, as will be described in more detail later in this specification. The mounting structures are located at the outer ends of the sliding structures and extend along the outer end of each sliding structure.

As stated previously, support arms 130, 140 are slidably mounted to base 110. FIG. 2 shows support arms 130, 140 in a first position where the sliding structures 131, 141, have been moved along base 110 such that they are in an opposed, extended position from each other. As such, inner ends 131A and 141A of sliding structures 131 and 141, respectively, are spaced apart. When the support arms 130, 140 are in a second position where the sliding structures 131, 141 have been converged towards each other, and consequently mounting structures 132 and 142 are positioned in closer relationship to each other, ends 131A and 141A abut each other.

In continuing with the discussion of the structure of support arms 130, 140, since each support arm's mounting structure is similarly constructed, a detailed description for mounting structure 132 of support arm 130 will only be provided. As shown in FIG. 1, mounting structure 132 extends above the plane of sliding structure 131 and includes a lower shelf 133 and an upper support structure 134. A processor card connection slot 135 is formed by the cavity that exists between the upper support structure 134 and the lower shelf 133. As will be described in more detail later in this specification, processor card 400 is electrically and physically secured to connector 100 by inserting the ends of processor card 400 into connection slots 135 and 145. As such, one or both of processor card connection slots 135 and 145 contain electrically conductive contacts (not shown) that provide for electrically connecting processor card 400 to connector 100. Lower shelf 133 includes an extended portion 133A and a recessed portion 133B. Extended portion 133A extends inside the inner most portion 134A of upper support 134 and recessed portion 133B extends outside the inner most portion 134A of upper support 134. The inner and outer directions referred to in this specification are relative to the transverse center of connector 100, which is illustrated by centerline 105 as shown in FIGS. 1 and 2.

Figure 3:
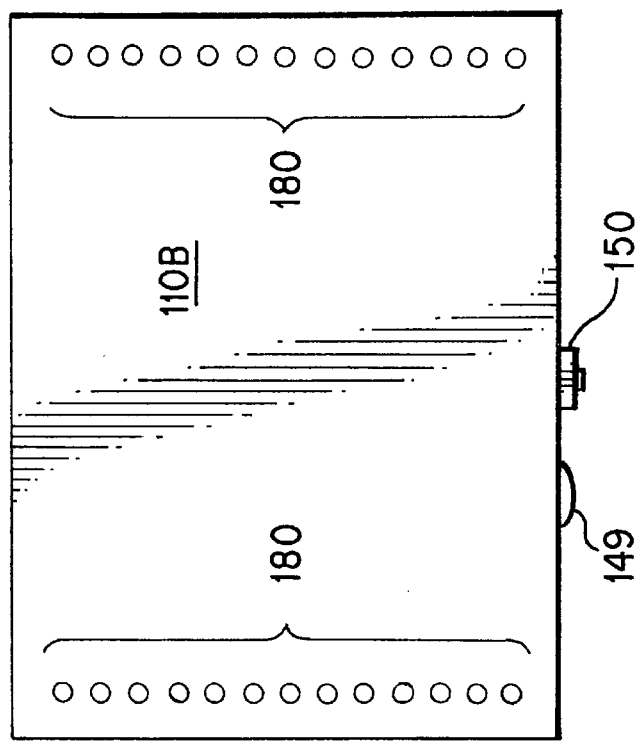
FIG. 3 is a bottom view of the connector of FIG. 1.

Base 110 of connector 100 is rigidly secured to motherboard 160 through conductors 180 that are installed on the bottom side 110B of base 110, as shown in FIGS. 1 and 3, and which are soldered to the motherboard. Base 110, and thus connector 100, is also electrically connected to motherboard 160 through conductors 180. Conductors 180 extend upward from base 110 through support arms 130, 140 and are connected to the contacts that are contained in processor card connection slots 135 and 145, as described previously. If contacts are not contained in both processor card connection slots, conductors 180 would only extend up through the support arm that contains the processor card connection slot contacts. Because support arms 130, 140 move relative to base 110, conductors 180 must be sufficiently flexible to accommodate the movement of the support arms.

Connector 100 can be physically and electrically connected to motherboard 160 though other types of conductor arrangements that are well known in the art and the present invention is not limited to any particular embodiment for connecting the connector 100 to motherboard 160.

Base 110 may also include alignment pins 190 as shown in FIGS. 1 and 2. The alignment pins, if provided, serve to assist in physically positioning the processor card within the connector. The alignment pins may be positioned on the top side 110A of base 110 so that when the pins are aligned with corresponding openings in the processor card 400, the card will be properly positioned with respect to connector 100 such that the card can be received within the upper support chassis 120 of connector 100.

FIGS. 1 and 2 illustrate four alignment pins 190 rigidly mounted on the top side 110A of base 110. The alignment pins extend upward from base 110 and through sliding structures 131 and 141 of support arms 130 and 140, respectively. Since, as described previously, sliding structures 131 and 141 slide along base 110, and thus move relative to base 110, openings 195 are provided in sliding structures 131 and 141, as shown in FIGS. 1 and 2, such that the sliding structures can move relative to base 110 and not be impeded in their movement by the alignment pins 190 which extend up through the sliding structures from the base and which do not move relative to the base.

The top most portion 192 of alignment pins 190 extends above the lower shelves 133 and 143 of mounting structures 132 and 142, respectively. This is desired in order to assist with the relative positioning of the card with respect to the shelves as the card is received within the upper support chassis 120. As will be further described, card 400 is ultimately positioned onto lower shelves 133 and 143 when the card is inserted into connector 100.

Connector 100 also includes handle 150. Handle 150 controls the operation, or motion, of support arms 130 and 140. Handle 150 is operably coupled to both arms 130 and 140 such that when handle 150 is in a first position, or the "open" position, the handle is positioned perpendicular to the support chassis 120 and base 110 and the support arms 130, 140 are positioned on base 110 in their first position which is the opposed, extended position. When handle 150 is moved to a second position, or the "closed" position, the handle is positioned parallel to the support chassis 120 and base 110 and the support arms 130, 140 are moved to their second position where mounting structures 132 and 142 are converged towards each other and located in the closest possible relationship to each other.

Handle 150, as illustrated, is an elongated member and is attached to connector 100 on only one side of the upper support chassis 120. Because handle 150 does not extend over the entire width of connector 100, it does not obstruct the placement of card 400 in connector 100. Handle 150 may be operably coupled to support arms 130, 140 in any of a variety of ways that are well-known in the art. The present invention is not limited to any particular mechanical connection mechanism for operably coupling handle 150 to support arms 130, 140.

Figure 4:
FIG. 4 is a front view of the connector of FIG. 1 with the handle in the closed position.

As is shown in FIG. 4, handle 150, when in the second or closed position, may be maintained in that position by providing a cam 149 on support arm 140 such that handle 150 may be maintained in the second position. As handle 150 is moved to the second position, handle 150 travels over cam 149 and is positioned on the underside of cam 149 when fully moved to the second position. In this manner, when handle 150 is in the second position, the handle is maintained in this position by cam 149. To move handle 150 to the first position, sufficient force must be applied to handle 150 to move the handle up and over cam 149.

FIGS. 5 and 6 illustrate the operation of connector 100 in an embodiment of the present invention. As shown in FIG. 5, in order to place processor card 400 in upper support chassis 120, support arms 130 and 140 must be moved to their first position where sliding structures 131 and 141 are moved along base 110 such that support arms 130 and 140 are in the opposed, extended position from each other. As described earlier, support arms 130 and 140 are moved to their first position by moving handle 150 to its first, or open, position, as shown in FIG. 5. When support arms 130, 140 are in this extended, opposed, first position, the distance separating mounting structure 132 of support arm 130 from mounting structure 142 of support arm 140 is slightly greater than the length of processor card 400. This separation distance between the mounting structures will allow for sufficient spacing between the mounting structures such that processor card 400 can be placed within upper support chassis 120.

In placing processor card 400 within support chassis 120, as described earlier, alignment pins 190 are aligned with openings (not shown) in processor card 400. Processor card 400 is then placed within connector 100 by positioning end 403 of processor card 400 onto extended portion 133A of lower shelf 133 and end 404 of card 400 onto extended portion 143A of lower shelf 143. When the processor card 400 is in this position, card 400 is supported along the entire width of the two ends 403 and 404 of card 400 by shelves 133 and 143. Also, when card 400 is in this position, card 400 is not yet positioned within connection slots 135 and 145.

FIG. 6 illustrates processor card 400 when it is securely connected, both physically and electrically, to connector 100. As can be seen in FIG. 6, handle 150 has been moved to its second, or closed, position, which in turn has moved support arms 130 and 140 along base 110 towards each other such that support arms 130 and 140 are in their second position, as described earlier. When handle 150 is closed and support arms 130 and 140 are moved towards each other, i.e, converged towards each other, as can be seen, ends 403 and 404 of processor card 400 are positioned within connector slots 135 and 145, respectively. Thus, in order to position processor card 400 in connector slots 135 and 145, card 400 is not moved, rather, movement of arms 130 and 140 towards each other, through interaction with handle 150, allow ends 403 and 404 of card 400 to be positioned within the connector's connection slots.

As mentioned previously, at least one of connection slots 135 and 145 contains electrical contacts as does at least one end 403 and 404 of card 400. Thus, when ends 403 and 404 are positioned within slots 135 and 145, electrical connection of card 400 to connector 100 is obtained.

Although specific embodiments are illustrated, other embodiments or variations are possible. Some examples will now be mentioned. In the illustrated embodiments, both support arms are slidably mounted on the base of the connector, however, it is not required that both arms be slidably mounted. One arm could be slidably mounted on the base with the other arm rigidly secured to the base. With this configuration, the handle would be operably connected to the slidable arm. The processor card would still be positioned into the connection slots of the support arms through the convergence of the two support arms, however, the convergence of the two arms would be accomplished by moving only one of the arms.

Additionally, it is not required that either of the two support arms be slidably mounted on the base of the connector. The mounting structures of the arms could be rotatably joined to the arms. In this configuration, the mounting structures could be rotated outward from the transverse centerline 105 of the connector, around a transverse axis, to allow for the positioning of the processor card within the upper support chassis. Once the processor card is positioned within the upper support chassis, the mounting structures would be rotated back towards the center of the connector in order to engage the ends of the processor card into the connector slots. In this manner, the ends of the processor card would be positioned within the connector slots through rotational movement of the mounting structures of the support arms rather than by translational movement of the support arms.

A handle is disclosed for moving the support arms, however, a handle as disclosed is not required in practicing the present invention. The support arms can be moved by hand or by other mechanical or electrical devices, e.g., a lever or motor.

Additionally, the mounting structures are not required to be configured as disclosed. For example, two separate mounting structures, rather than one contiguous mounting structure, can be provided on each support arm. Alternatively, a mounting structure with a connection slot could only be provided on one support arm. This one connection slot would provide for electrical connection of the processor card to the connector and, thus, the motherboard.

Alignment pins 190 may be provided and are not required when practicing the present invention. If alignment pins are utilized, various quantities of pins and placement locations for the pins on the base can be utilized depending on the requirements of the particular application.

Motherboard 160 is described as the motherboard of a personal computer. However, the present invention is not limited to mounting a processor card to such a motherboard. The present invention can be utilized for mounting a processor card to other types of integrated circuit cards that may be contained in a variety of electronic devices. Additionally, the present invention is not limited to any particular embodiment for the processor card and the electronic components and circuits that may be included on the processor card. The present invention may be utilized to connect a variety of configurations for processor cards to motherboards.

As described above, a connector for mounting a processor card on a motherboard is provided. The connector provides for easily mounting a processor card substantially parallel to a motherboard. The present invention enables mounting the card to the board without requiring complex supporting structures, while providing the card's larger surface areas as the supporting surfaces. Additionally, while it is preferable to horizontally mount the processor card to the motherboard in order to allow heat to directly dissipate off of the card, i.e, rise directly away from the processor, thus facilitating dissipation of heat from the processor, it is not required to horizontally mount the processor card. The processor card is mounted to the motherboard in a parallel orientation with respect to the motherboard. If the motherboard is installed vertically with respect to the electronic apparatus in which it is installed, the processor card can be mounted vertically with respect to the electronic apparatus, but yet in parallel orientation with respect to the motherboard.

The disclosed embodiments are illustrative of the various ways in which the present invention may be practiced. Other embodiments can be implemented by those skilled in the art without departing from the spirit and scope of the present invention.

What is claimed is:

1. A connector comprising:
   a base electrically and structurally coupled to a motherboard; and
   an upper support chassis slidably mounted on said base and disposed to receive a processor card in an orientation parallel to the motherboard, wherein said upper support chassis includes a plurality of integrally formed opposed support arms adapted to receive within them a portion of the processor card.

2. The connector of claim 1 wherein at least one of said plurality of support arms is slidably mounted on said base.

3. The connector of claim 2 further comprising a handle operably coupled to said at least one of said plurality of support arms.

4. The connector of claim 1 further comprising at least one alignment pin mounted on said base.

5. The connector of claim 1 wherein each of said support arms include a connection slot adapted to engage an end of the processor card and wherein said support arms are slidably mounted on said base, said support arms being movable between a first position and a second position.

6. The connector of claim 5 further comprising a handle operably coupled to said support arms and wherein when said handle is moved to a first position said support arms are moved to said first position and wherein when said handle is moved to a second position said support arms are moved to said second position.

7. The connector of claim 6 further comprising a cam on one of said support arms and wherein said handle includes a first end and a second end, said first end operably coupled to said support arms and said second end cooperating with said cam to lock said handle to said one of said support arms when said handle is in said second position.

8. A method for mounting a processor card in a connector mounted on a motherboard, the connector including a base and an upper support chassis and the upper support chassis including two opposed support arms slidably mounted on the base, comprising the steps of:

diverging said support arms away from each other;

inserting a processor card within said upper support chassis in an orientation parallel to the motherboard;

converging said support arms towards each other; and engaging the processor card with said support arms.

9. The method for mounting a processor card of claim 8 wherein said steps of diverging and converging said support arms comprises moving a handle operably coupled to said support arms.

10. The method for mounting a processor card of claim 8 further comprising the step of aligning the processor card within said upper support chassis by utilizing an alignment pin connected to said base.

11. A connector comprising:

a base electrically and structurally coupled to a motherboard; and an upper support chassis mounted on said base and disposed to receive a processor card in an orientation parallel to the motherboard, said upper support chassis including two opposed support arms wherein each of said support arms include a connection slot adapted to engage an end of a processor card and wherein said support arms are slidably mounted on said base, said support arms being movable between a first position and a second position.

12. The connector of claim 11 further comprising a handle operably coupled to said support arms and wherein when said handle is moved to a first position said support arms are moved to said first position and wherein when said handle is moved to a second position said support arms are moved to said second position.

13. The connector of claim 12 further comprising a cam on one of said support arms and wherein said handle includes a first end and a second end, said first end operably coupled to said support arms and said second end cooperating with said cam to lock said handle to said one of said support arms when said handle is in said second position.

* * * * *

UNITED STATES PATENT AND TRADEMARK OFFICE
CERTIFICATE OF CORRECTION

PATENT NO. : 6,056,601
DATED : May 2, 2000
INVENTOR(S) : Steven L. Pollock et al.

Page 1 of 1

It is certified that error appears in the above-identified patent and that said Letters Patent is hereby corrected as shown below:

Column 7
Line 4, after "processor card" insert -- ; and a plurality of flexible electrical connectors, said flexible electrical connectors extending upward from said base and received within said upper support chassis --.

Signed and Sealed this

Eleventh Day of September, 2001

*Attest:*

Nicholas P. Godici

*Attesting Officer*

NICHOLAS P. GODICI
*Acting Director of the United States Patent and Trademark Office*